(12) United States Patent
Madurawe

(10) Patent No.: US 6,803,804 B2
(45) Date of Patent: Oct. 12, 2004

(54) PROGRAMMABLE LATCH ARRAY USING ANTIFUSES

(76) Inventor: Raminda U. Madurawe, 882 Louise Dr., Sunnyvale, CA (US) 94087

( * ) Notice: Subject to any disclaimer, the term of this patent is extended or adjusted under 35 U.S.C. 154(b) by 0 days.

(21) Appl. No.: 10/155,508

(22) Filed: May 24, 2002

(65) Prior Publication Data

US 2003/0218487 A1 Nov. 27, 2003

(51) Int. Cl.[7] .............................................. H01H 37/76
(52) U.S. Cl. ..................... 327/525; 327/276; 365/225.7
(58) Field of Search ................................ 327/525, 276, 327/277, 281; 365/96, 225.7, 185.18

(56) References Cited

U.S. PATENT DOCUMENTS 5,973,978 A * 10/1999 Cutter et al. ............. 365/225.7
6,242,335 B1 * 6/2001 Sher et al. ................. 438/600
6,421,293 B1 * 7/2002 Candelier et al. ........ 265/225.7

* cited by examiner

Primary Examiner—Timothy P. Callahan
Assistant Examiner—Hiep Nguyen
(74) Attorney, Agent, or Firm—Tran & Associates

(57) ABSTRACT

A latch includes an inverter; a pass transistor having a first terminal coupled to an input of the inverter and a second terminal coupled to a programming voltage; a first capacitor having a first terminal coupled to the input of the inverter and a second terminal coupled to a first predetermined voltage; and a second capacitor having a first terminal coupled to the input of the inverter and a second terminal coupled to a second predetermined voltage; wherein each of the first and second capacitors uses an antifuse.

16 Claims, 4 Drawing Sheets

PROGRAMMABLE LATCH ARRAY USING ANTIFUSES

BACKGROUND

In the manufacture of integrated circuitry, post-fabrication programmability is desirable for applications that select one or more functions from a plurality of pre-fabricated circuit blocks. Programmability is also desirable for applications that need to select redundant circuit elements when not all of the circuitry or components prove operable upon testing. Antifuses are commonly used to provide such programmability. An antifuse is a component which upon activation or "blowing" creates a short between two conductors. The conductors can be structures such as silicon substrate and a polysilicon line; a polysilicon line and another polysilicon line; or two metal lines. Horizontal lines with one conductor type are created and vertical lines with the second conductor type are then created to form a grid. The intersection points of the grid are separated by an insulator between the two conductors. The insulator is designed to be burned or "popped" at a relatively high voltage. The isolation between the two lines is thick, and small windows are made by the insulators that are designed to be programmed at selected voltages. Typically, the grid forms an array that supports programmability for between 1,000 to 64,000 bits. Once burned, the antifuses irreversibly short the two conductor lines and thus are known as one-time programmable (OTP) antifuses.

After fabrication, a programmer can select a horizontal line and a vertical line and apply a relatively high voltage difference between these lines and "pop" the insulator located at the intersection point between the horizontal and vertical lines. Once popped, the horizontal and vertical lines are electrically shorted together. The quality of the connection depends on the flow of current through the dielectric of the shorted lines. It is important to keep this constant for all the antifuses in the array. For example, if the structure is formed from a metal line and a polysilicon line, the metal line has a lower resistance compared to polysilicon line. The location of the fuse would divide the total path resistance to a metal component and polysilicon component, thus varying the total resistance with the fuse location. More current would flow through the fuse at the grid corner with the longest metal line, and shortest polysilicon line. The capacitance of the grid lines can also affect the performance quality of the connection since a high capacitance can create signal transit time delays.

SUMMARY

In one aspect, a latch includes an inverter; a pass transistor having a first terminal coupled to an input of the inverter and a second terminal coupled to a programming voltage; a first capacitor having a first terminal coupled to the input of the inverter and a second terminal coupled to a first predetermined voltage; and a second capacitor having a first terminal coupled to the input of the inverter and a second terminal coupled to a second predetermined voltage; wherein each of the first and second capacitors uses an antifuse.

Implementations of the above aspect may include one or more of the following. The first and second oxide layers can be positioned in the n-well active stripe. The oxide regions can be treated as PMOS transistor regions with high threshold voltages before the deposition of the polysilicon stripe. The oxide regions can be treated as NMOS transistors with high LDN implants and n+ dopant implant after polysilicon deposition and etching. The resistance of the polysilicon stripe or the n-well active stripe can be reduced using a salicide process. A metal strap can be coupled to one or more n-well active stripes with contacts placed at one or more predetermined locations to minimize n-well stripe resistance. Programming circuitry can be coupled to the n-well active stripe and the polysilicon stripe. A PMOS decoder can be coupled to the polysilicon stripe to deliver a negative programming voltage. A positive voltage can be applied to the n-well active stripe and a negative voltage is applied to the polysilicon stripe. The grid can include an array of n-well active stripes and an array of polysilicon stripes. The polysilicon stripe can be n+ doped. The n-well stripe can, be adjacent an STI isolation oxide region. A salicided polysilicon layer can be formed above the polysilicon stripe. A dielectric layer can be formed above the salicided polysilicon layer. At least one metal line can be formed above the dielectric layer. Additional elements can include one or more additional inverters; one or more additional pass transistors each having a first terminal coupled to an input of a corresponding inverter and a second terminal coupled to a programming voltage; one or more additional first capacitors each having a first terminal coupled to the input of the corresponding inverter and a second terminal coupled to the first predetermined voltage; and one or more additional second capacitors each having a first terminal coupled to the input of the corresponding inverter and a second terminal coupled to the second predetermined voltage.

BRIEF DESCRIPTION OF THE DRAWINGS

Preferred embodiments of the invention are described below with reference to the following accompanying drawings.

DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
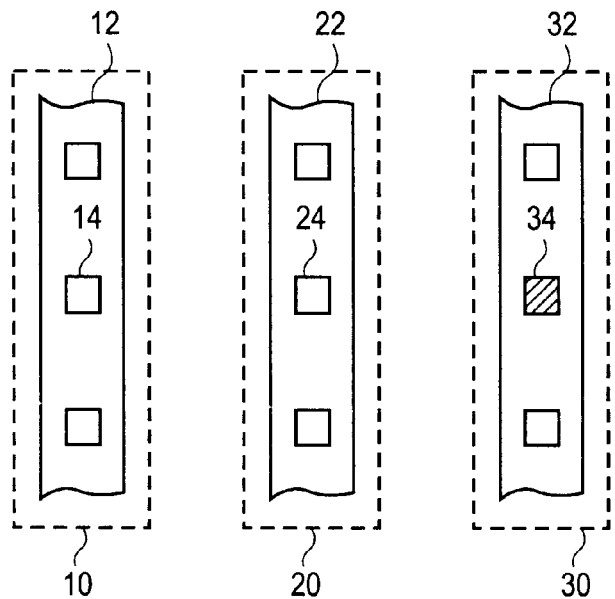
FIG. 1 shows one embodiment of an antifuse array structure.

Referring now to FIG. 1, one embodiment of an antifuse array structure is shown. In this embodiment, a dual oxide antifuse structure is integrated on standard CMOS dual-oxide technology. First, columns 10, 20 and 30 are fabricated by opposite type dopant diffusion. The columns 10, 20 and 30 can be n-well columns on p-type substrate. Inside the n-well columns 10, 20 and 30, active areas 12, 22 and 32 are defined. Relatively thick oxides are grown on these active regions while allowing for small windows of thin oxides 14, 24, and 34 in the thick oxides 12, 22 and 32. Standard dual-oxidation scheme is used to grow these two oxides. First a pre-defined intermediate oxide is grown in the entire regions 10, 20 and 30. Using a mask, regions 12, 22 and 32 are defined and etched to bare silicon. Then the entire regions are re-oxidized such that regions 12, 22 and 32 get the required thin oxide. The pre-defined oxide thickness is calculated for regions 10, 20 and 30 to get the required thick oxide level after the second oxidation. To illustrate, on 1.8 volt CMOS process supporting 3.3 I/O voltage, the thick gate oxide can be approximately seventy angstroms thick while the thin gate oxide can be approximately forty angstroms thick. The region between each active area is covered with a field oxide. In one implementation, a technique called shallow trench isolation (STI) can be used to define field oxide. The active regions 12, 22 and 32 inside n-well columns 10, 20 and 30 act as conductors.

To ensure that the active regions act as conductors, one or more of the following can be done:
(1) implant n-well dopant that is an n-type
(2) avoid masked "B" implants to minimize the "neutralization" effects of opposite type dopants so NMOS $V_t$ implants are blocked
(3) allow masked "As, P" type implants to maximize conductivity so PMOS $V_t$ implants requiring As, P are allowed, but any B implants would be blocked.

Although the embodiment of FIG. 1 first defines the n-well columns 10, 20 and 30, other embodiments can define the active areas 12, 22 and 32 before the n-well columns 10, 20 and 30 are defined. The structure can be mirrored to form p-well columns inside n-type substrate; or any other double diffused dopant scheme where conducting columns can be formed.

Figure 2:
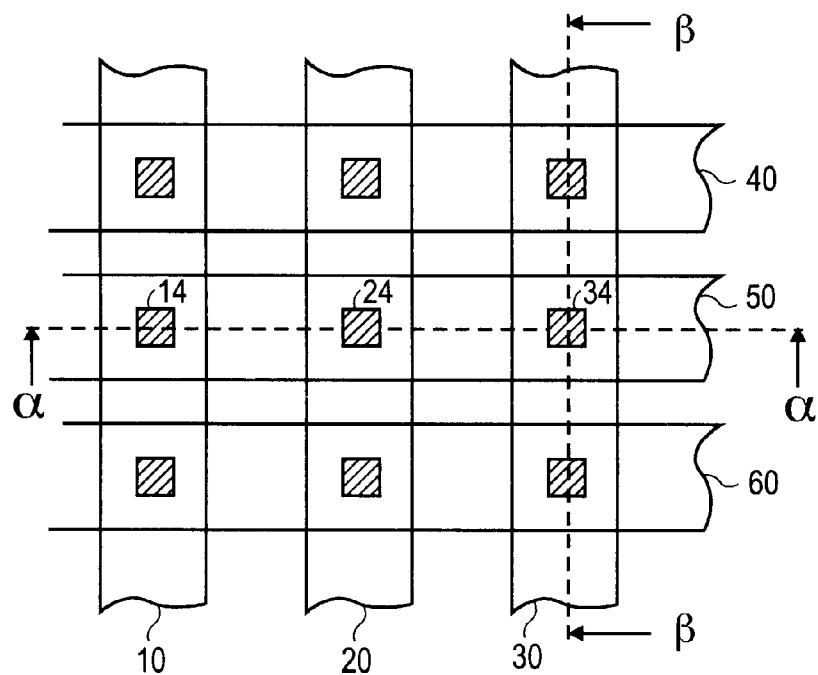
FIG. 2 shows an antifuse polysilicon region.

Next, as shown in FIG. 2, polysilicon is deposited and patterned into horizontal stripes 40, 50 and 60 covering the thin oxide windows 14, 24 and 34. The polysilicon stripes fully cover the thin oxide windows 14, 24 and 34 with margins on the two sides that line up with their corresponding active regions. The active area processing scheme follow the steps of forming PMOS transistors channel regions inside n-wells, with the exception of the dual oxide windows under the polysilicon gate. The PMOS transistor channel has high n-type (As, P) concentration to meet the transistor threshold requirement. The polysilicon processing over the regions overlapping windows 14, 24 and 34 are equivalent to NMOS transistors gate polysilicon processing. In these regions, the polysilicon is implanted with n+ dopant.

The polysilicon stripes 40, 50 and 60 are etched. Next, an LDN implant process is used that contains high levels of As and P implants to improve the conductivity of the tip regions of the transistor structure. In one implementation, a 3.3 volt NMOS LDN mask and a 1.8 volt NMOS LDN mask can be applied to provide double dosages of As and P implants.

A layer of spacer oxide is deposited and spacers are formed. The whole region is exposed to n+ implantation process in a manner similar to a process to form NMOS transistor and n+ tap/n-well formation. The doped polysilicon acts in the same manner as n-well dopant type. Further, the implantation process maintains n-type conductive columns along the active strips in the vertical direction. The n+ polysilicon doping avoids potential formation of PN type diodes that can form in a p+ polysilicon doping (typically used for PMOS transistors gates). Such PN diodes would hinder current flow and would negatively affect fuse blowing properties of the antifuse structure.

The polysilicon stripes 40, 50 and 60 and the active regions 10, 20 and 30 are "salicided" with titanium or cobalt as is conventionally done. Each resulting polysilicon or polycide provides a low resistance horizontal conductor. Each vertical conductor is silicided up to the edge of its corresponding spacer.

The diffusion region can be strapped with a vertical wide metal line to lower the resistance of each column further. The metal strapping can be done at any repetition. For example, the strapping can be done at each polysilicon line, each alternate polysilicon line, or can skip by a predetermined count of polysilicon lines. Contacts are then created between the stripes 40, 50 and 60 and the active regions 10, 20 and 30.

Figure 3:
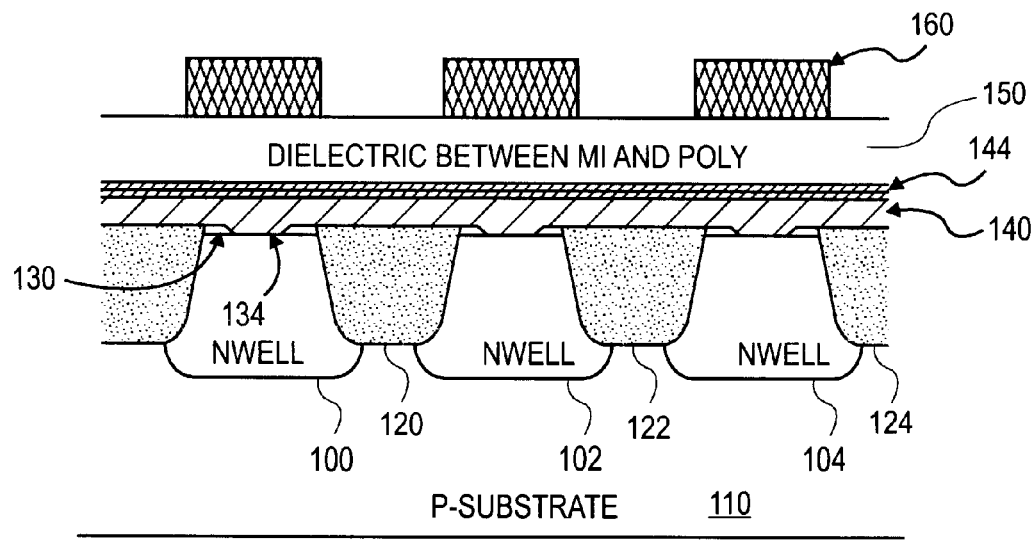
FIG. 3 shows a cross-sectional view of the antifuse embodiment of FIG. 2 along line $\alpha$-$\alpha$.

FIG. 3 shows a cross-sectional view of the antifuse embodiment of FIG. 2 along line α-α. A plurality of n-well regions 100, 102 and 104 are formed in a p-substrate 110. The n-well regions 100, 102 and 104 are separated by STI isolation oxide regions 120, 122 and 124. A relatively thin oxide window 134 is formed in the relatively thick oxide region 130 formed above the n-well 100. An n+ doped polysilicon stripe 140 is formed above the relatively thick oxide region 130 and the relatively thin oxide region 134. A salicided polysilicon layer 144 is formed above the polysilicon stripe 140. A dielectric layer 150 rests above the polysilicon layer 144, and a series of metal lines 160 are formed above the dielectric layer 150.

Figure 4:
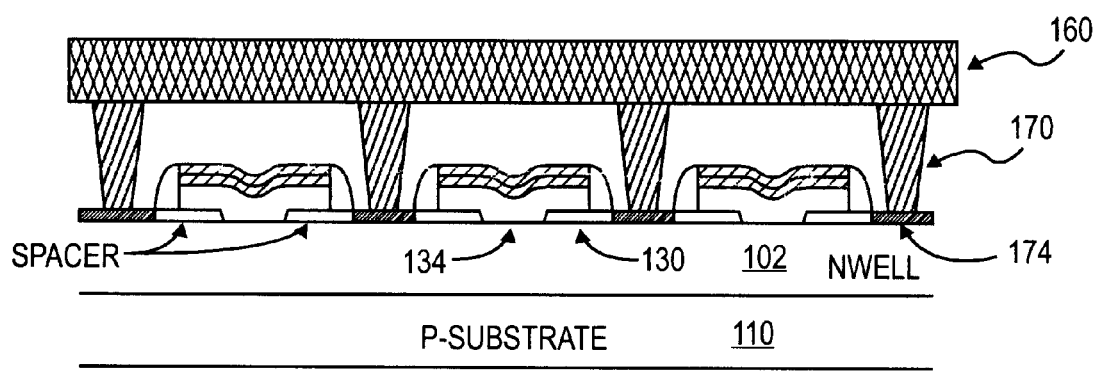
FIG. 4 shows a cross-sectional view of the antifuse embodiment of FIG. 2 along line $\beta$-$\beta$.

FIG. 4 shows a cross-sectional view of the antifuse embodiment of FIG. 2 along line β-β. As in FIG. 3, the n-well region 100 rests above the p-substrate 110. The relatively thick oxide region 130 and the relatively thin oxide window 134 are formed above the n-well region 100. The dielectric layer 150 is positioned inbetween the polysilicon layer 144 and the metal line 160. A plurality of w-plug contacts 170 is formed above silicide portions 174 that are separated by spacers or a safe distance from the polysilicon.

Figure 5:
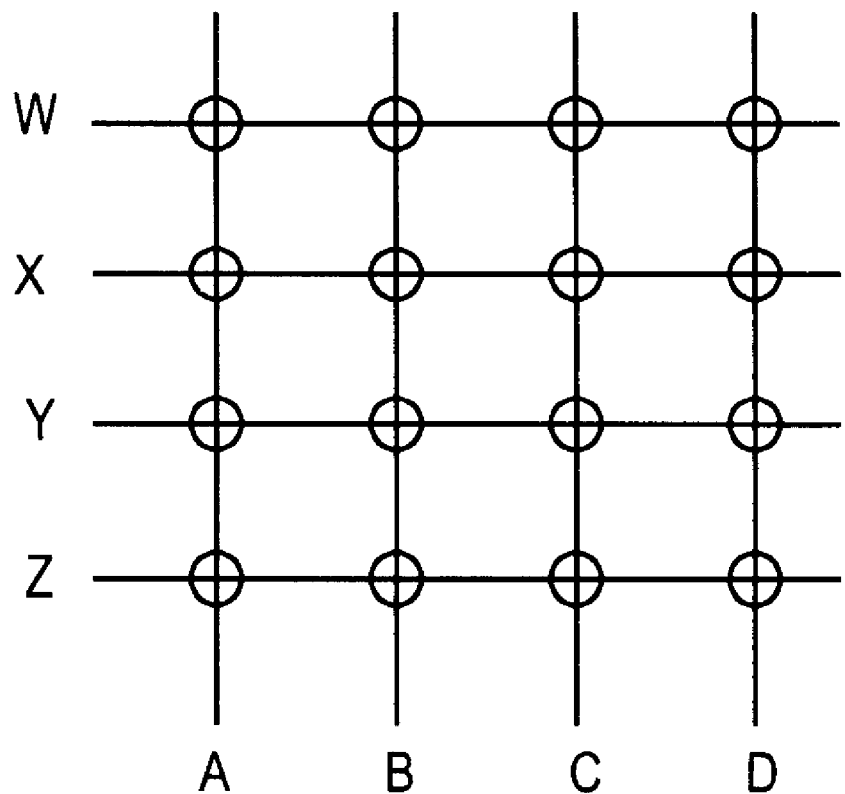
FIG. 5 shows an exemplary 4×4 array for programming.

FIG. 5 shows an exemplary 4×4 array for programming. The exemplary process for this array supports both 1.8 volt and 3.3 volt I/O integration. In this example, the relatively thick oxide layer is tolerant up to 3.3 volts and the relatively thin oxide layer is tolerant up to 1.8 volts. In another embodiment, these oxide thicknesses may be different. For example in a lower 1.0 volt CMOS process with 2.5 volt I/O support, the two oxides may be 25 angstroms, and 55 angstroms respectively. Further, both layers can withstand a guard-band with voltage variations of +10%. In this example, A, B, C, and D are n-well nodes, and either zero volt or 3.6 volt (3.3 volt +10% variation) can be applied to these nodes. Further, W, X, Y and Z are polysilicon nodes and either zero or −3.6 volts can be applied to these nodes using PMOS decode circuitry. The n-wells carry 3.6 volts, and adjacent n-wells support 3.6 volt to 3.6 volt isolation. Further, the spacing between the n-wells are selected to avoid punch through and minimize leakage between adjacent n-wells.

If window $W_B$ is to be programmed, $V_W$ is set to −3.6 volts, while $V_B$ is set to +3.6 volts, and the rest is set to zero volt. The thin oxide at $W_B$ is stressed at 7.2 volts. The stress is about 18 Megavolts per centimeter (MV/cm). Since typical oxides tunnel at about 10 MV/cm, the window $W_B$ ruptures while the thick oxide surrounding the thin oxide receives only 10 MV/cm and does not pop. The remaining thin oxide nodes are stressed only up to ±9 MV/cm at ±3.6 volts stress level. Hence, the remaining thin oxide nodes enter the tunneling condition, but does not pop.

The programming voltages can be optimized to the processing quality of the oxide layer. By optimizing the voltages, a programmer can fine tune a reliable set of programming voltages to pop only the desired oxide node while minimizing the risk of damage to surrounding nodes.

To recap, FIGS. 1–5 show an oxide-based antifuse. The oxide is a dual oxide: 1.8 volt tolerant oxide surrounded by a 3.3 volt tolerant oxide. The oxide regions are inside n-well active stripes. Until the deposition of polysilicon, these regions are treated like they are PMOS transistor regions with high PMOS $V_t$s. After a polysilicon etch, the process treats these regions like NMOS transistors with high LDN implants and n+ polysilicon doping. The salicide process is used to reduce the resistance of the polysilicon and the active area. The n-well columns can be strapped by metals with contacts placed at a predetermined frequency to minimize resistance. The antifuses can be programmed by applying +3.6 volts to n-wells and −3.6 volts (through PMOS decoding) to the polysilicon lines. This voltage can be optimized for the oxide quality in the process.

Figure 6:
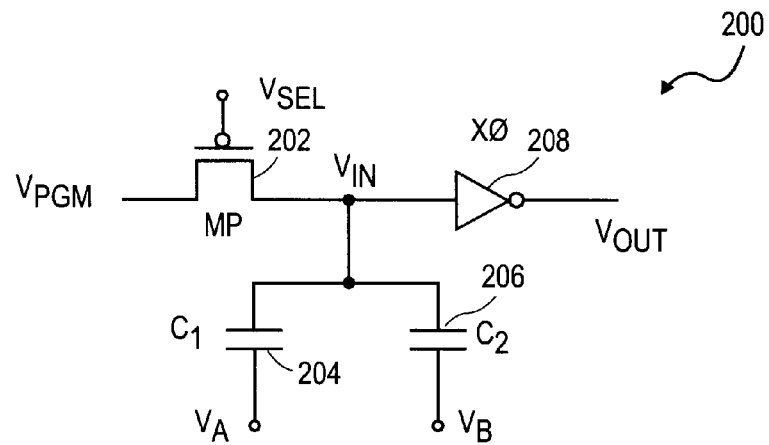
FIG. 6 shows a schematic diagram of an exemplary one time programmable latch using antifuses.

The antifuse can be used in a number of applications, including a programmable latch and latch arrays. FIG. 6 shows a single programmable latch 200 having two capacitors $C_1$ 204 and $C_2$ 206. The capacitors 204 and 206 are two antifuse capacitors having terminals connected to two separate voltage lines $V_A$ and $V_B$. The second terminals of the capacitors $C_1$ 204 and $C_2$ 206 are commonly connected to an input $V_{IN}$ of an inverter 208. In one embodiment, the inverter 208 operates off a 1.8 volt power supply rail and has a thick oxide to prevent damage during programming. The input to the inverter 208 is also connected to a PMOS transistor MP 202. In another embodiment this transistor 202 may be an NMOS transistor located inside a triple diffused p-well inside n-well over p-substrate region. The transistor 202 is controlled by a select signal $V_{SEL}$ to provide a programming voltage $V_{PGM}$ to the common input of the capacitor $C_1$ 204 and $C_2$ 206.

The latch 200 operates in three stages: unprogrammed stage, programming stage, and operational stage. Initially, after fabrication, the capacitors $C_1$ 204 and $C_2$ 206 isolate $V_{IN}$ from $V_A$ and $V_B$. Here, $V_{OUT}$ is insensitive to $V_A$ and $V_B$. By varying $V_{IN}$ from logic zero to logic one by sequencing $V_{SEL}$ and $V_{PGM}$ signal lines, the latch 200 and capacitors 204 and 206 can be tested for manufacturing defects.

During programming phase, depending on the desired output, either (but not both) capacitor $C_1$ 204 or $C_2$ 206 can be blown while the inverter 208 floats. If the capacitor $C_1$ 204 is blown, $V_{IN}=V_A$ and if the capacitor $C_2$ 206 is blown, $V_{IN}=V_B$. For example, in one embodiment, to program the capacitor $C_1$ 204, $V_A$ is set to 3.6 volts, $V_B$ is set to zero, $V_{PGM}$ is set to −3.6 volts, and $V_{SEL}$ is set to −5 volts. The transistor 202 passes −3.6 volts to $V_{IN}$ and the thin oxide in the capacitor $C_1$ 204 is stressed at 7.2 volts and breaks, shorting $V_{IN}$ to $V_A$. The capacitor $C_2$ 206 is only stressed to 3.6 volts, and the thin oxide does not break.

During operation, the pass transistor 202 is off and the output of the inverter 208 is the invert of $V_{IN}$, which is $V_A$ or $V_B$, depending on the capacitor previously programmed.

Figure 7:
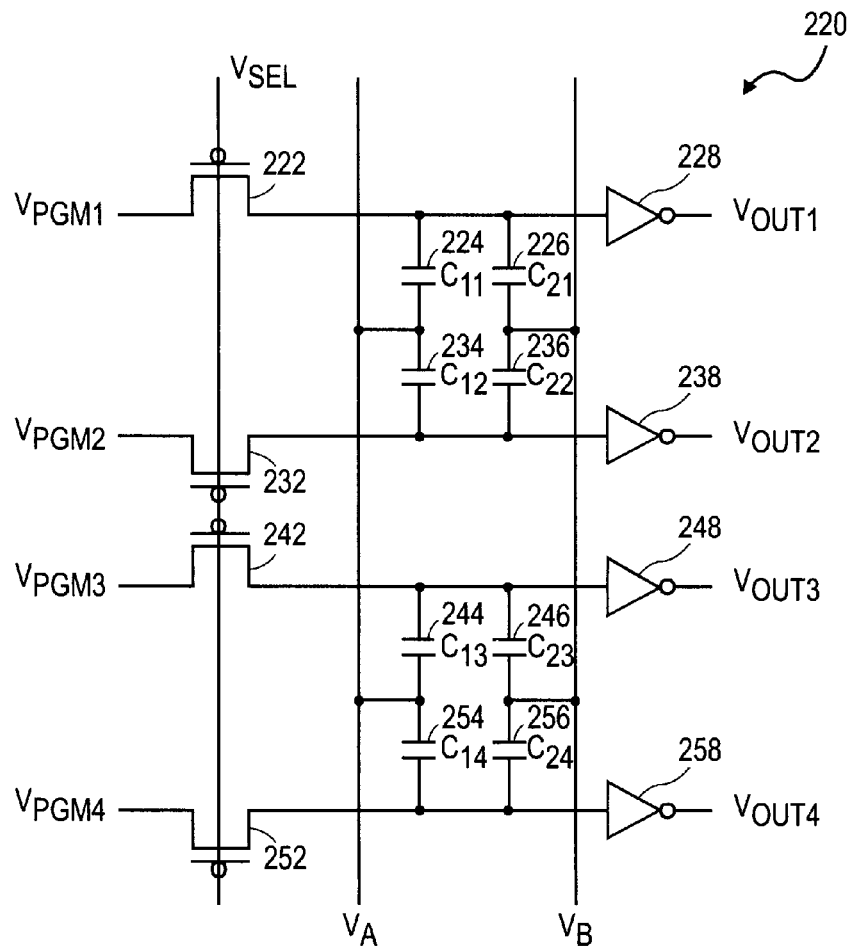
FIG. 7 shows an exemplary one time programmable 4-bit latch array using antifuses.

FIG. 7 shows an exemplary 4-bit one time programmable latch 220. In the latch 220, a plurality of pass transistors 222, 232, 242 and 252 are controlled by $V_{SEL}$. Further, each of pass transistors 222, 232, 242, and 252 are positioned between programming voltage input signals $V_{PGM1}$–$V_{PGM4}$ and inverters 228, 238, 248 and 258, respectively. $V_A$ is connected to one common end of capacitors $C_{11}$ 224 and $C_{12}$ 234 and to one common end of capacitors $C_{13}$ 244 and $C_{14}$ 254, respectively. Similarly, $V_B$ is connected to one common end of capacitors $C_{21}$ 226 and $C_{22}$ 236 and to one common end of capacitors $C_{23}$ 246 and $C_{24}$ 256, respectively.

The programming of the latch 220 is done is two stages. In one example, for the first stage, $V_A$ is set to 3.6 volts and $V_B$ is grounded. The bit to be programmed or fuse blown is identified from the column containing capacitors $C_{11}$, $C_{12}$, $C_{13}$ and $C_{14}$ or the $V_A$ column. The $V_{PGM}$ nodes of the fuses to be blown are set to −3.6 volts, while the $V_{PGM}$ nodes of the fuses to be left intact are grounded. When $V_{SEL}$ is set to −5 volts, the pass transistors 222, 232, 242 and 252 allow the $V_{PGM}$ voltages to pass through and the predetermined fuses are blown. In the second stage, $V_B$ is set at 3.6 volts and $V_A$ is grounded. The bit to be programmed or fuse blown is identified from the column containing capacitors $C_{21}$, $C_{22}$, $C_{23}$ and $C_{24}$ or the $V_B$ column. The $V_{PGM}$ nodes of the fuses to be blown are set to −3.6 volts, while the $V_{PGM}$ nodes of the fuses to be left intact are grounded. When $V_{SEL}$ is set to −5 volts, for example, the pass transistors 222, 232, 242 and 252 allow the $V_{PGM}$ voltages to pass through and the predetermined fuses in the second column are blown. During operation, $V_A$ and $V_B$ are set to predetermined logic levels, logic zero and logic one voltages, and the output of inverters 228, 238, 248 and 258 are reflected as $V_{OUT1}$–$V_{OUT4}$.

The one time programmable latch 200 and latch array 220 consume no stand-by power and can be programmed to logic ones or zeros as desired using the antifuses.

The antifuse is suitable for virtually any integrated circuit where a fuse or antifuse is desirable to store permanent data. For example, the antifuse can be used as part of a generic integrated memory address circuit to select redundant rows or columns within a ROM, EEROM, PROM, flash RAM, or DRAM. In many embodiments, the integrated circuit is part of a larger system, such as computer system or more generally a computerized system including a microprocessor or digital signal processor coupled to the memory circuit. In addition to the antifuses, memory address circuit includes a set of address transistors, a set of redundant address transistors, and conventional laser fuses. Address transistors are conventionally used to address rows or columns in the memory array. Each row or column includes one or more memory cells. One or more of the above antifuses and one or more of laser fuses can be selectively programmed to replace one or more of memory rows or columns with redundant memory row or column. In some embodiments, one or more of the antifuses are programmed and one or more others remain unprogrammed, and in some embodiments all the antifuses are either programmed or unprogrammed.

In another embodiment, the antifuses-an be used in a programmable logic array. For example, a logic array patterned after a NOR—NOR field-programmable array (FPLA), includes NOR sub-arrays, representative inputs, field-effect transistors, antifuses, and representative outputs. With the exception for the novel antifuses and related programming techniques, the programmable logic array operates in accord with conventional programmable logic arrays. Although shown with field-effect transistors, the array can be implemented using other transistor technologies, such as bipolar junction transistors or mixed transistors technologies, such as bipolars and field-effect transistors. In some embodiments, the programmable logic array is used with a microprocessor or digital signal processor in a larger system.

In yet another embodiment, the antifuse can be used in a mixed mode wireless communicator device fabricated on a single silicon integrated chip. The device can be an integrated CMOS device with radio frequency (RF) circuits, including a cellular radio core, a short-range wireless transceiver core, and a sniffer. The CMOS device's analog circuit blocks can sit along side digital circuits, including a reconfigurable processor core, a high-density memory array core, and a router. The high-density memory array core can include various memory technologies such as flash memory and dynamic random access memory (DRAM), among others, on different portions of the memory array core. The reconfigurable processor core can include one or more processors such as RISC processors and/or one or more digital signal processors (DSPs) 153, among others.

Variations to the above embodiments can be done. For instance, in lieu of the PMOS decoder, an NMOS decoder inside a dual well (ie Pwell inside Nwell over P substrate) can be used. With NMOS pass gate, the gate does not need to be charged to ±5V level to pass −3.6V inside, eliminating the need to generate −5V level. The polarity of the above embodiments can be also reversed. To illustrate, if the substrate type was N-substrate (instead of P-sub), another implementation can use NMOS decoder, Pwell stripes for anti-fuses, NMOS processing until poly deposition, PMOS processing after poly deposition. The anti-fuse is now sandwiched between P+ doped polysilicon and p-substrate. The voltages can be chosen such that a minimal electric field is required to rupture the required oxide, while reducing the electric-field by 50% over the ones to be protected. Thus, the oxide rupture may be as low as 7 MV/cm. Moreover, in normal mode operation $V_A$, $V_B$ voltages can be in the Vcc-Vss range of the latch to get full CMOS output from the latch. This generates a full CMOS output from the latch such that no sense amplification is required. The thin insulator can be oxide, any oxide-nitride, or any other combination of dielectrics. The anti-fuse can be made from oxide nitride oxide (ONO) between two poly layers on a dual-polysilicon technology such as Flash technology.

The embodiments described above are intended only to illustrate and teach one or more ways of practicing or implementing the present invention, not to restrict its breadth or scope. The actual scope of the invention, which encompasses all ways of practicing or implementing the concepts of the invention, is defined only by the following claims and their equivalents.

What is claimed is:

1. A latch, comprising:
   an inverter;
   a pass transistor having a first terminal coupled to an input of the inverter and a second terminal coupled to a programming voltage;
   a first capacitor having a first terminal coupled to the input of the inverter and a second terminal coupled to a first predetermined voltage; and
   a second capacitor having a first terminal coupled to the input of the inverter and a second terminal coupled to a second predetermined voltage;
   wherein each of the first and second capacitors uses an antifuse and wherein the antifuse further comprises:
      a grid having at least one n-well active stripe and at least one polysilicon stripe;
      a first oxide layer having a first oxide thickness, the first oxide layer adapted to electrically short the n-well active stripe with the polysilicon stripe; and
      a second oxide layer surrounding the first oxide layer and thicker than the first oxide layer.

2. The latch of claim 1, wherein the first and second oxide layers are positioned in the n-well active stripe.

3. The latch of claim 1, wherein the oxide regions are treated as PMOS transistor regions with high threshold voltages before the deposition of the polysilicon stripe.

4. The latch of claim 1, wherein the oxide regions are treated as NMOS transistors with high LDN implants and n+ dopant implant after polysilicon deposition and etching.

5. The latch of claim 4, wherein the resistance of the polysilicon stripe or the n-well active stripe is reduced using a salicide process.

6. The latch of claim 1, further comprising a metal strap coupled to one or more n-well active stripes with contacts placed at one or more predetermined locations to minimize resistance.

7. The latch of claim 1, further comprising programming circuitry coupled to the n-well active stripe and the polysilicon stripe.

8. The latch of claim 1, further comprising a PMOS decoder coupled to the polysilicon stripe to deliver a negative programming voltage.

9. The latch of claim 1, wherein a positive voltage is applied to the n-well active stripe and a negative voltage is applied to the polysilicon stripe.

10. The latch of claim 1, wherein the grid further comprises an array of n-well active stripes and an array of polysilicon stripes.

11. The latch of claim 1, wherein the polysilicon stripe is n+ doped.

12. The latch of claim 1, wherein the n-well stripe is adjacent an STI isolation oxide region.

13. The latch of claim 1, further comprising a salicided polysilicon layer formed above the polysilicon stripe.

14. The latch of claim 13, further comprising a dielectric layer above the salicided polysilicon layer.

15. The latch of claim 14, further comprising at least one metal line formed above the dielectric layer.

16. A latch, comprising:
    an inverter;
    a pass transistor having a first terminal coupled to an input of the inverter and a second terminal coupled to a programming voltage;
    a first capacitor having a first terminal coupled to the input of the inverter and a second terminal coupled to a first predetermined voltage; and
    a second capacitor having a first terminal coupled to the input of the inverter and a second terminal coupled to a second predetermined voltage, wherein
       each of the first and second capacitors uses an antifuse;
       one or more additional inverters;
       one or more additional pass transistors each having a first terminal coupled to an input of a corresponding inverter and a second terminal coupled to a corresponding programming voltage;
       one or more additional first capacitors each having a first terminal coupled to the input of the corresponding inverter and a second terminal coupled to the first predetermined voltage; and
       one or more additional second capacitors each having a first terminal coupled to the input of the corresponding inverter and a second terminal coupled to the second predetermined voltage.

* * * * *